United States Patent
Chen et al.

(10) Patent No.: US 10,490,539 B2
(45) Date of Patent: Nov. 26, 2019

(54) PACKAGE ON-PACKAGE STRUCTURE INCLUDING A THERMAL ISOLATION MATERIAL AND METHOD OF FORMING THE SAME

(71) Applicant: Taiwan Semiconductor Manufacturing Company, Ltd., Hsin-Chu (TW)

(72) Inventors: Meng-Tse Chen, Changzhi Township (TW); Kuei-Wei Huang, Hsin-Chu (TW); Tsai-Tsung Tsai, Taoyuan (TW); Ai-Tee Ang, Hsin-Chu (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 155 days.

(21) Appl. No.: 15/228,098

(22) Filed: Aug. 4, 2016

(65) Prior Publication Data

US 2016/0343698 A1 Nov. 24, 2016

Related U.S. Application Data

(63) Continuation of application No. 13/671,665, filed on Nov. 8, 2012, now Pat. No. 9,418,971.

(51) Int. Cl.
*H01L 21/44* (2006.01)
*H01L 21/48* (2006.01)
(Continued)

(52) U.S. Cl.
CPC .............. *H01L 25/50* (2013.01); *H01L 21/56* (2013.01); *H01L 23/10* (2013.01);
(Continued)

(58) Field of Classification Search
CPC ...... H01L 21/56; H01L 23/10; H01L 23/3128; H01L 23/42; H01L 23/49811; H01L 23/5385; H01L 24/73; H01L 25/105
(Continued)

(56) References Cited

U.S. PATENT DOCUMENTS 7,492,039 B2 * 2/2009 Seng ................... H01L 23/3128
257/686
8,698,304 B2 * 4/2014 Yoo ...................... H01L 25/0657
257/724
(Continued)

FOREIGN PATENT DOCUMENTS

| JP | 2004006564 A | 1/2001 |
|---|---|---|
| KR | 100809701 B1 | 3/2008 |
| KR | 1020120089150 A | 8/2012 |

*Primary Examiner* — Duy T Nguyen
*Assistant Examiner* — Dilinh P Nguyen
(74) *Attorney, Agent, or Firm* — Slater Matsil, LLP

(57) ABSTRACT

A semiconductor device includes a first package component and a second package component. The first package component has a first die formed on a first substrate. A second package component has a second die formed on a second substrate. A thermal isolation material is attached on the first die, wherein the thermal isolation material thermally insulates the second die from the first die, and the thermal isolation material has a thermal conductivity of from about 0.024 W/mK to about 0.2 W/mK. A first set of conductive elements couples the first package component to the second package component.

11 Claims, 3 Drawing Sheets

(51) Int. Cl.
  *H01L 25/00* (2006.01)
  *H01L 23/31* (2006.01)
  *H01L 23/10* (2006.01)
  *H01L 25/10* (2006.01)
  *H01L 23/42* (2006.01)
  *H01L 23/498* (2006.01)
  *H01L 23/538* (2006.01)
  *H01L 23/00* (2006.01)
  *H01L 21/56* (2006.01)

(52) U.S. Cl.
  CPC .......... *H01L 23/3128* (2013.01); *H01L 23/42* (2013.01); *H01L 23/49811* (2013.01); *H01L 23/5385* (2013.01); *H01L 24/73* (2013.01); *H01L 25/105* (2013.01); *H01L 2224/16225* (2013.01); *H01L 2224/32145* (2013.01); *H01L 2224/32225* (2013.01); *H01L 2224/48227* (2013.01); *H01L 2224/73253* (2013.01); *H01L 2224/73265* (2013.01); *H01L 2225/0651* (2013.01); *H01L 2225/1023* (2013.01); *H01L 2225/1058* (2013.01); *H01L 2225/1094* (2013.01); *H01L 2924/1431* (2013.01); *H01L 2924/1434* (2013.01); *H01L 2924/15311* (2013.01); *H01L 2924/15331* (2013.01); *H01L 2924/3511* (2013.01)

(58) Field of Classification Search
  USPC ............... 438/107, 109, 110, 124, 126, 127; 257/686, 777, 786, 787
  See application file for complete search history.

(56) References Cited

U.S. PATENT DOCUMENTS

| | | |
|---|---|---|
| 2004/0053442 A1 | 3/2004 | Akram et al. |
| 2005/0133916 A1 | 6/2005 | Kamezos |
| 2007/0042530 A1* | 2/2007 | Kim .................. H01L 27/14618 438/108 |
| 2007/0158833 A1* | 7/2007 | Park ...................... H01L 21/561 257/734 |
| 2010/0110651 A1 | 5/2010 | Goetz et al. |
| 2011/0304015 A1* | 12/2011 | Kim ...................... H01L 23/552 257/532 |
| 2012/0193783 A1 | 8/2012 | Hong et al. |
| 2012/0243569 A1 | 9/2012 | Tanaka et al. |
| 2012/0280404 A1 | 11/2012 | Kwon et al. |
| 2012/0306103 A1 | 12/2012 | Yoshimura et al. |

\* cited by examiner

PACKAGE ON-PACKAGE STRUCTURE INCLUDING A THERMAL ISOLATION MATERIAL AND METHOD OF FORMING THE SAME

PRIORITY CLAIM AND CROSS-REFERENCE

This application is a continuation of U.S. patent application Ser. No. 13/671,665, entitled "Package-on-Package Structure Including a Thermal Isolation Material and Method of Forming the Same," filed on Nov. 8, 2012, which application is incorporated herein by reference.

BACKGROUND

Package-on-package (POP) is becoming an increasingly popular integrated circuit packaging technique because it allows for higher density electronics.

A conventional package-on-package structure may include a bottom package component and a top package component. The bottom package component may include a bottom die attached to a bottom substrate and the top package component may include a top die attached to a top substrate. The bottom package component is coupled to the top package component typically by a set of conductive elements, such as solder balls. In operation, both package components generate heat. However, excessive heat that is generated by the bottom die, especially where the bottom die is a device die, may cause damage to the top die. The heat can also cause thermal stress and warpage in the package-on-package structure leading to cracks in the solder balls. Even with the use of molding compounds in the package-on-package structure, the problem of excess heat and warpage still cannot be entirely eliminated.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
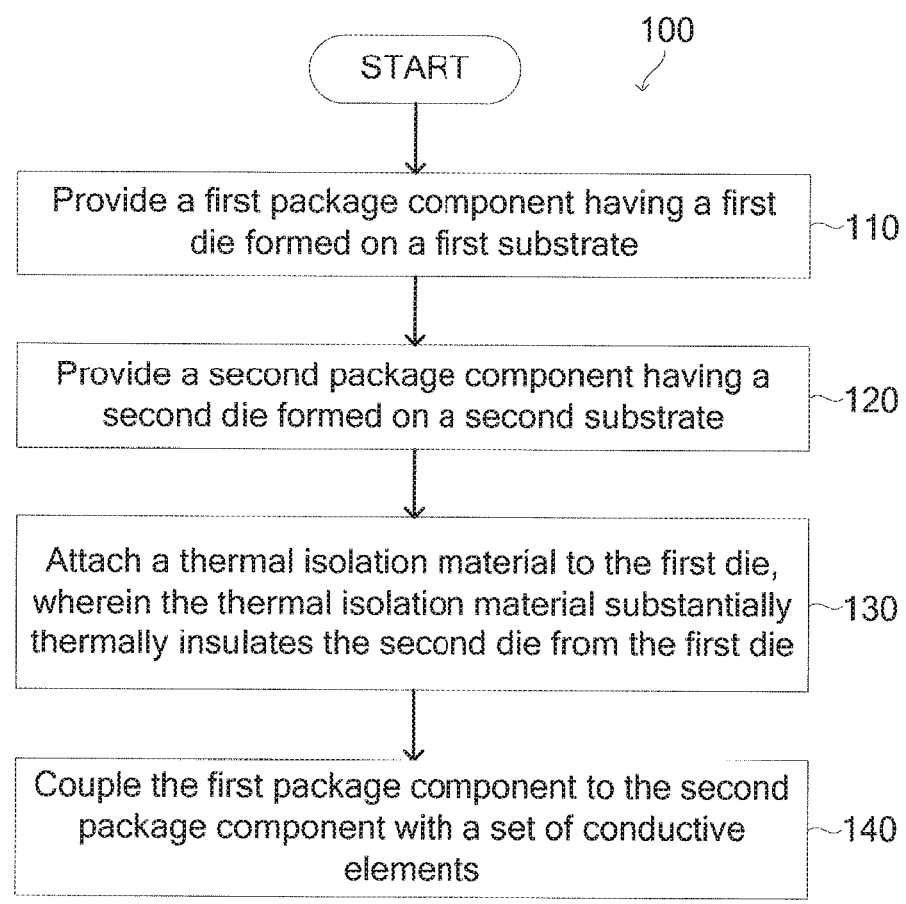
FIG. 1 is a flowchart of a method of fabricating a package-on-package structure according to various embodiments of the present disclosure.

FIG. 1 is a flowchart of a method 100 for fabricating a package-on-package according to various aspects of the present disclosure. Referring to FIG. 1, the method includes block 110, in which a first package component is provided, the first package component having a first die formed on a first substrate. The method 100 includes block 120, in which a second package component is provided, the second package component having a second die formed on a second substrate. The method 100 includes block 130, in which a thermal isolation material is attached to the first die. The thermal isolation material substantially thermally insulates the second die from the first die. The method 100 includes block 140, in which the first package component is coupled to the second package component with a set of conductive elements.

It is understood that additional processes may be performed before, during, or after the blocks 110-140 shown in FIG. 1 to complete the fabrication of the package-on-package structure, but these additional processes are not discussed herein in detail for the sake of simplicity.

FIGS. 2-6 are diagrammatic fragmentary cross-sectional side views of a top package and/or a bottom package at various fabrication stages of manufacturing a package-on-package structure according to embodiments of the method 100 of FIG. 1. It is understood that FIGS. 2-6 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 2:
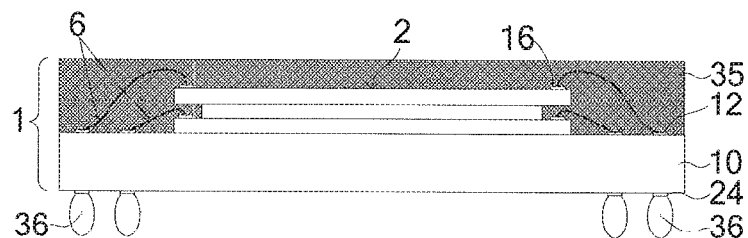
FIGS. 2-6 are cross-sectional views of a top package and/or a bottom package at various intermediate stages in the manufacture of a package-on-package structure, in accordance with various embodiments of the present disclosure.

An embodiment package-on-package structure will be discussed with reference to FIGS. 2-6. FIG. 2 illustrates a top package 1 to be employed in the package-on-package structure. Top package 1, which may be formed using a plastic ball grid array (PBGA) package assembly process or the like, includes a plurality of stacked die 2, which may be wired bonded to top substrate 10 by way of contacts 16 (on respective stacked die 2), bond wires 6, and contacts 12 (on top substrate 10). Individual stacked die may comprise a memory chip, a logic chip, a processor chip, or the like. Although FIG. 2 illustrates three stacked die, this is for illustration only. Likewise, the use of wire bonding is merely illustrative, and other approaches for electrically connecting the stacked die are within the contemplated scope of the present disclosure. For example, solder bumps, solder balls, copper pillars, conductive bumps, solder caps, conductive pillars, conductive balls, under-bump metallurgies, and/or other connector elements may also be contemplated to connect stacked die 2 to top substrate 10. In some embodiments, an underfill (not shown) is dispensed into the gap between stacked die 2 and top substrate 10 to reinforce the strength of the package-on-package structure.

Top substrate 10 may be a laminated circuit board comprised of alternating layers of non-conductive polymers, such as bismaleinide-triazine (BT), and patterned (or non-patterned) conductive layers. As discussed above, top substrate 10 has contacts 12 on a first side (referred to herein sometimes as a top side for convenience) for electrical connection to stacked die 2. Top substrate 10 further has bottom contacts 24 on a second side (sometimes referred to as a bottom side) for electrical connection to other components as will be detailed further below. Solder balls 36 are attached to bottom contacts 24 to top substrate 10. Solder balls 36 allow for electrical and/or thermal connection between top package 1 and a bottom package 34 (not shown in FIG. 2, but illustrated in FIGS. 3 and 4). In the illustrated embodiment, solder balls 36 provide for electrical conduction of signals and power to stacked die 2. Again, other connection components, such as conductive bumps, conductive balls, conductive pillars, and the like, could be employed in lieu of solder balls 36.

In some embodiments, a molding compound 35 is applied to top package 1 to provide mechanical stiffness and enhance the mechanical strength of the package-on-package structure. It is believed that this mechanical stiffness prevents, or at least reduces, the severity of warpages resulting from, for example, thermal expansion mismatch between the components of the resulting package. Molding compound 35 may be molded on substrate 10 and surrounds stacked die 2 and bond wires 6 using, for example, compressive molding or transfer molding. A curing step may then be performed to solidify the molding compound 35. The molding compound 35 may comprise a polymer-based material, an underfill, a molding underfill (MUF), an epoxy, or the like.

Figure 3:
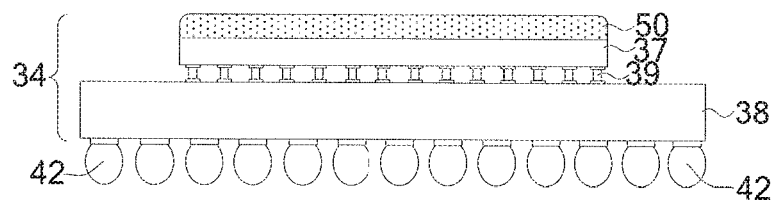
Figure 5:
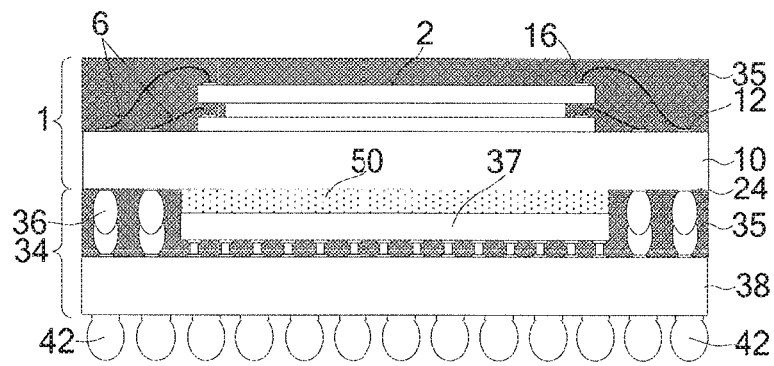

Top package 1 is attached to a bottom package 34, as illustrated in FIG. 5 by way of solder balls 36. As depicted in FIG. 3, the bottom package 34 includes die 37, which is flip chip attached to a bottom substrate 38, and which is electrically connected thereto by way of connector elements 39. Die 37 may comprise a logic chip, a processor chip, a memory chip, or the like. Connector elements 39 may include, for example solder bumps, solder balls, copper pillars, conductive bumps, solder caps, conductive pillars, conductive balls, and under-bump metallurgies. In some embodiments, an underfill (not shown) is dispensed into the gap between die 37 and bottom substrate 38 to reinforce the strength of the package-on-package structure. Electrical connection between die 37 and an underlying mother board or other circuitry (not shown) is provided by through vias (not shown) aligned with connector elements 39 on one side of bottom substrate 38 and connector elements 42 on the other side of bottom substrate 38. Likewise, electrical connection between top substrate 10 and an underlying mother board or other circuitry is provided by solder balls 36, through vias, and connector elements 42.

In operation, both the bottom package 34 and the top package 1 that include die 37 and stacked die 2, respectively generate heat. Heat that is generated by die 37, especially where the bottom die is a processor die, may cause damage to the top die or stacked die 2. The heat can also cause thermal stress and warpage in the package-on-package structure leading to cracks in the connector elements, such as solder balls. An advantageous feature of the package-on-package structure of the present disclosure is a thermal isolation material layer 50 of the bottom package 34, as depicted in FIG. 3, attached above die 37 and thermally insulates stacked die 2 from the heat generated by die 37. In one embodiment, as an additional benefit because the top package 1 and bottom package 34 are insulated from heat thanks to the thermal isolation material layer 50, warpage in the package-on-package structure is better controlled. In other words, thermal isolation material layer 50 provides resistance to warping that might otherwise occur as a result of thermal coefficient of expansion (CTE) mismatch between top package 1 and bottom packager 34.

In some embodiments, the thermal isolation material layer 50 is a material having a thermal conductivity of from about 0.024 W/mK to about 0.2 W/mK. The thermal isolation material layer 50 may comprise a porous film, a wax film, a die attach film (DAF), an aerogel, a tape, or an adhesive. The thermal isolation material layer 50 may comprise a solder paste, an adhesive, or thermal grease. In some embodiments, the thermal isolation material layer 50 has a thickness ranging from about 10 microns to about 100 microns.

FIG. 5 shows the thermal isolation material layer 50 in the package-on-package structure where the bottom package 34 is attached to the top package 1.

Figure 4:
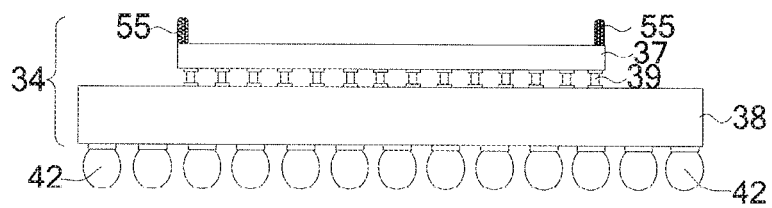
Figure 6:
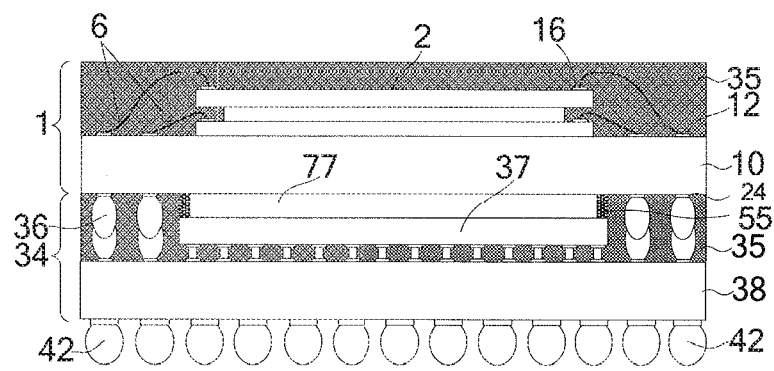

In other embodiments, the thermal isolation material is used to form a thermal isolation seal ring having air or vacuum 77 therein, as shown in FIG. 4 and as shown in FIG. 6. In accordance with these embodiments, the thermal isolation material is alternatively referred to as the thermal isolation seal ring 55, which is in the package-on-package structure where the bottom package 34 is attached to top package 1. Air or vacuum is an ideal thermal insulator under normal operation conditions. In other embodiments, the thermal isolation seal ring 55 provides a thermal conductivity of about 0 W/mK. Thermal isolation seal ring 55 is dispensed on die 37 to provide a vacuum gap during a molding process that will be explained below.

After either the thermal isolation material layer 50 or the thermal isolation seal ring 55 has been applied to die 37, in some embodiments, a molding compound 35 is applied to bottom package 34 to provide mechanical stiffness and enhance the mechanical strength of the package-on-package structure. Molding compound 35 may be molded on substrate 38 and surround die 37 and connector elements 39 using, for example, compressive molding or transfer molding. A curing step may then be performed to solidify the molding compound 35. The molding compound 35 may comprise a polymer-based material, an underfill, a molding underfill (MUF), an epoxy, or the like. Referring back to FIG. 4, to form the air or vacuum 77, the molding compound 35 is formed around the thermal isolation seal ring 55, thereby encapsulating the air or vacuum 77 therein.

The package-on-package structures shown in FIGS. 2-6 are only for illustrative purpose and are not limiting. Additional embodiments can be conceived.

Advantages of one or more embodiments of the present disclosure may include one or more of the following.

In one or more embodiments, in a package-on-package structure having a top package with a top die and a bottom package with a bottom die, the top die is substantially insulated from the heat generated by the bottom die.

In one or more embodiments, warpage in a package-on-package structure is better to control because the top package and the bottom package are substantially insulated from heat.

The present disclosure has described various exemplary embodiments. According to one embodiment, a semiconductor device includes a first package component and a second package component. The first package component has a first die formed on a first substrate. The second package component has a second die formed on a second substrate. A first set of conductive elements couples the first package component to the second package component. A thermal isolation material is applied on the first die and interjacent the first package component and the second package component, wherein the thermal isolation material thermally insulates the second die from the first die. In some embodiments, the thermal isolation material includes a seal ring and an air gap.

According to another embodiment, a package-on-package includes a bottom package component and a top package component. The bottom package component has at least a bottom die formed on a bottom substrate. The top package component has at least a top die formed on a top substrate. A thermal isolation material is attached to the bottom die, wherein the thermal isolation material thermally insulates the top die from the bottom die. The thermal isolation material has a thermal conductivity of from about 0.024 W/mK to about 0.2 W/mK. A first set of conductive elements couples the bottom substrate to the top substrate. In some embodiments, the thermal isolation material includes a seal ring and an air gap.

According to yet another embodiment, a method of forming a package is disclosed. A first package component is provided, and the first package component has a first die formed on a first substrate. A second package component is provided, and the second package component has a second die formed on a second substrate. A thermal isolation material is attached to the first die, wherein the thermal isolation material thermally insulates the second die from the first die. The first package component is coupled to the second package component with a first set of conductive elements. In some embodiments, the thermal isolation material includes a seal ring and an air gap.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method comprising:
   bonding a first die to a first substrate to form a first package component;
   disposing a thermal isolation material to form a seal ring on a top surface of the first die, wherein the seal ring has a plurality of sides, each adjacent to an edge of the first die, wherein the seal ring is dispensed to have outer edges of the seal ring aligned to corresponding edges of the first die; and
   bonding a second package component to the first package component, wherein a bottom surface of the second package component contacts the seal ring, and the first die, the second package component, and the seal ring encloses air or vacuum therein.

2. The method of claim 1 further comprising dispensing an encapsulating material to encircle the seal ring and the first die.

3. The method of claim 2, wherein the encapsulating material is in contact with outer edges of the seal ring, and inner edges of the seal ring are exposed to the air or the vacuum.

4. The method of claim 1 further comprising forming the second package component comprising:
   bonding a second die to a second substrate; and
   encapsulating the second die in a molding compound.

5. The method of claim 1, wherein the seal ring encircles air therein.

6. The method of claim 1, wherein a space encircled by the seal ring is vacuumed.

7. A method comprising:
   bonding a first die to a first substrate through a plurality of connector elements;
   form a seal ring on a top surface of the first die, wherein the seal ring encircles a space therein;
   dispensing an encapsulating material to encircle and contact the seal ring, wherein the seal ring is dispensed to have outer edges aligned to corresponding edges of the first die;
   curing the encapsulating material, wherein a topmost surface of a continuous region of the encapsulating material is coplanar with a top edge of the seal ring; and
   bonding a package component to the first substrate, wherein a bottom surface of the package component contacts the seal ring and the encapsulating material to seal the space.

8. The method of claim 7, wherein the seal ring encircles air therein.

9. The method of claim 7 further comprising forming the package component comprising:
   bonding a second die to a second substrate; and
   encapsulating the second die in a molding compound.

10. The method of claim 7, wherein the outer edges of the seal ring extend from a top surface of the first die to the bottom surface of the package component.

11. The method of claim 7, wherein the encapsulating material is dispensed after the seal ring is disposed.

* * * * *